(12) United States Patent
Park et al.

(10) Patent No.: US 12,262,621 B2
(45) Date of Patent: Mar. 25, 2025

(54) DISPLAY DEVICE

(71) Applicant: SAMSUNG DISPLAY CO., LTD., Yongin-si (KR)

(72) Inventors: Jung Woo Park, Yongin-si (KR); Kwang Soo Bae, Yongin-si (KR); Byung Han Yoo, Yongin-si (KR); Dae Young Lee, Yongin-si (KR); Hyun Dae Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/364,606

(22) Filed: Aug. 3, 2023

(65) Prior Publication Data

US 2024/0138241 A1   Apr. 25, 2024
US 2024/0237499 A9   Jul. 11, 2024

(30) Foreign Application Priority Data

Oct. 20, 2022   (KR) .................. 10-2022-0135947

(51) Int. Cl.
*G06F 3/041* (2006.01)
*G06F 3/044* (2006.01)
*H10K 39/34* (2023.01)
*H10K 59/40* (2023.01)
*H10K 59/80* (2023.01)
*G06V 40/12* (2022.01)

(52) U.S. Cl.
CPC ....... *H10K 59/8791* (2023.02); *G06F 3/0418* (2013.01); *G06F 3/0445* (2019.05); *H10K 39/34* (2023.02); *H10K 59/40* (2023.02); *G06F 2203/04111* (2013.01); *G06V 40/12* (2022.01)

(58) Field of Classification Search
CPC ......... G09G 3/3648; G09G 2320/0209; G09G 3/3696; G09G 2340/16
See application file for complete search history.

(56) References Cited

U.S. PATENT DOCUMENTS

| | | | |
|---|---|---|---|
| 11,281,320 B2 | 3/2022 | Heo et al. | |
| 2010/0013813 A1* | 1/2010 | Katoh | G06F 3/042 345/207 |
| 2011/0051007 A1* | 3/2011 | Hosaka | G09G 3/3648 348/673 |
| 2012/0147272 A1* | 6/2012 | Hosaka | G09G 3/3648 348/607 |
| 2013/0257844 A1* | 10/2013 | Kitagawa | G09G 3/3696 345/212 |
| 2017/0025084 A1* | 1/2017 | Mizusako | G09G 3/3655 |
| 2023/0104772 A1 | 4/2023 | Kim et al. | |

FOREIGN PATENT DOCUMENTS

| | | |
|---|---|---|
| CN | 110364114 | 10/2019 |
| KR | 10-2019-0114644 | 10/2019 |
| KR | 10-2023-0048211 | 4/2023 |

\* cited by examiner

*Primary Examiner* — Van N Chow
(74) *Attorney, Agent, or Firm* — CHAU & ASSOCIATES, LLC

(57) ABSTRACT

A display device includes a light emitting sub-pixel disposed in a display area, a light receiving pixel disposed in one of the display area or a non-display area, and a touch sensing layer including a sensing conductive layer overlapping with the light receiving pixel.

27 Claims, 13 Drawing Sheets

DA: A1, A2
PSR: PSR1, PSR2

PSR: PSR1, PSR2

LD1: AE, EML1, CE
OPD1: E1, OPL1, E2
MT: MT1, MT2

LD1: AE, EML1, CE
OPD1: E1, OPL1, E2
MT: MT1, MT2

OPD2: E1, OPL2, E2
MT: MT1, MT2

OPD2: E1, OPL2, E2
MT: MT1, MT2

OPD2: E1, OPL2, E2
MT: MT1, MT2

OPD2: E1, OPL2, E2
MT: MT1, MT2

MT1: BE
MT2: TE, RE

DISPLAY DEVICE

CROSS-REFERENCE TO RELATED APPLICATION

The present application claims priority under 35 U.S.C. § 119(a) to Korean patent application No. 10-2022-0135947, filed on Oct. 20, 2022, with the Korean Intellectual Property Office, the entire disclosure of which is incorporated by reference herein.

BACKGROUND

1. Technical Field

One or more embodiments described herein relate to a display device.

2. Related Art

Interest in information displays has increased significantly in recent years. They are used in all sorts of electronics including, but not limited to, smart phones, televisions, computers, and wearable devices. Because of the popularity and use of information displays, research and development is continuously being conducted to develop new products and improvements that are of interest to consumers.

SUMMARY

In accordance with an aspect of the present disclosure, there is provided a display device including: a light emitting sub-pixel disposed in a display area; a light receiving pixel disposed in the display area or a non-display area; and a touch sensing layer including a sensing conductive layer overlapping with the light receiving pixel.

The sensing conductive layer may include an opening overlapping with the light emitting sub-pixel.

The display device may further include a light blocking layer disposed above the light receiving pixel.

The light blocking layer may include an opening overlapping with a light emitting layer of the light emitting sub-pixel.he sensing conductive layer may include first sensing electrodes disposed along a first direction.

The sensing conductive layer may include second sensing electrodes disposed along a second direction intersecting the first direction.

The display device may further include connection electrodes connecting the adjacent first sensing electrodes to each other.

The sensing conductive layer may include: a first sensing conductive layer; a second sensing conductive layer disposed on the first sensing conductive layer; and an insulating layer disposed between the first sensing conductive layer and the second sensing conductive layer.

The first sensing conductive layer may include the connection electrodes.

The second sensing conductive layer may include the first sensing electrodes and the second sensing electrodes.

In accordance with another aspect of the present disclosure, there is provided a display device including: a first light receiving pixel disposed in a display area; a second light receiving pixel disposed in the display area or a non-display area; and a touch sensing layer including a sensing conductive layer overlapping with the second light receiving pixel.

The display device may further include a first light emitting sub-pixel disposed in the display area.

The sensing conductive layer may include an opening overlapping with the first light emitting sub-pixel.

The display device may further include a second light emitting sub-pixel disposed in the display area.

The sensing conductive layer may include an opening overlapping with the second light emitting sub-pixel.

The first light receiving element may include: a first electrode; a second electrode disposed on the first electrode; and a first light receiving layer disposed between the first electrode and the second electrode.

The second light receiving element may include a second light receiving layer disposed between the first electrode and the second electrode.

The first light receiving layer and the second light receiving layer may include the same material.

The display device may further include a light emitting sub-pixel including a light emitting layer disposed between the first electrode and the second electrode.

The display device may further include a light blocking layer disposed above the second light receiving pixel.

In accordance with one or more other embodiments, a display device comprising: a sub-pixel configured to emit light; at least one sensing conductive layer; a first light sensing pixel in a display area; and a second light sensing pixel in a non-display area, wherein the first light sensing pixel is configured to sense light emitted from the sub-pixel, as reflected from a finger, to detect a fingerprint and wherein: the at least one sensing conductive layer includes an opening aligned with a light receiving layer of the first light sensing pixel, and the at least one sensing conductive layer overlaps with a light receiving layer of the second light sensing pixel.

The at least one sensing conductive layer may be positioned to block external light from being received by the light receiving layer of the second light sensing pixel.

The display device may further include a driving circuit configured to calibrate the first light sensing pixel based on a signal received through the light receiving layer of the second light sensing pixel.

The driving circuit may be configured to perform dark calibration of the first light sensing pixel.

The driving circuit may be configured to perform white calibration of the first light sensing pixel.

The at least one sensing conductive layer may include: a first sensing conductive layer overlapping with the light receiving layer of the second light sensing pixel; and a second sensing conductive layer including an opening aligned with the light receiving layer of the second light sensing pixel.

The first sensing conductive layer may be electrically coupled to the second sensing conductive layer in an area between the sub-pixel and the first light sensing pixel.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
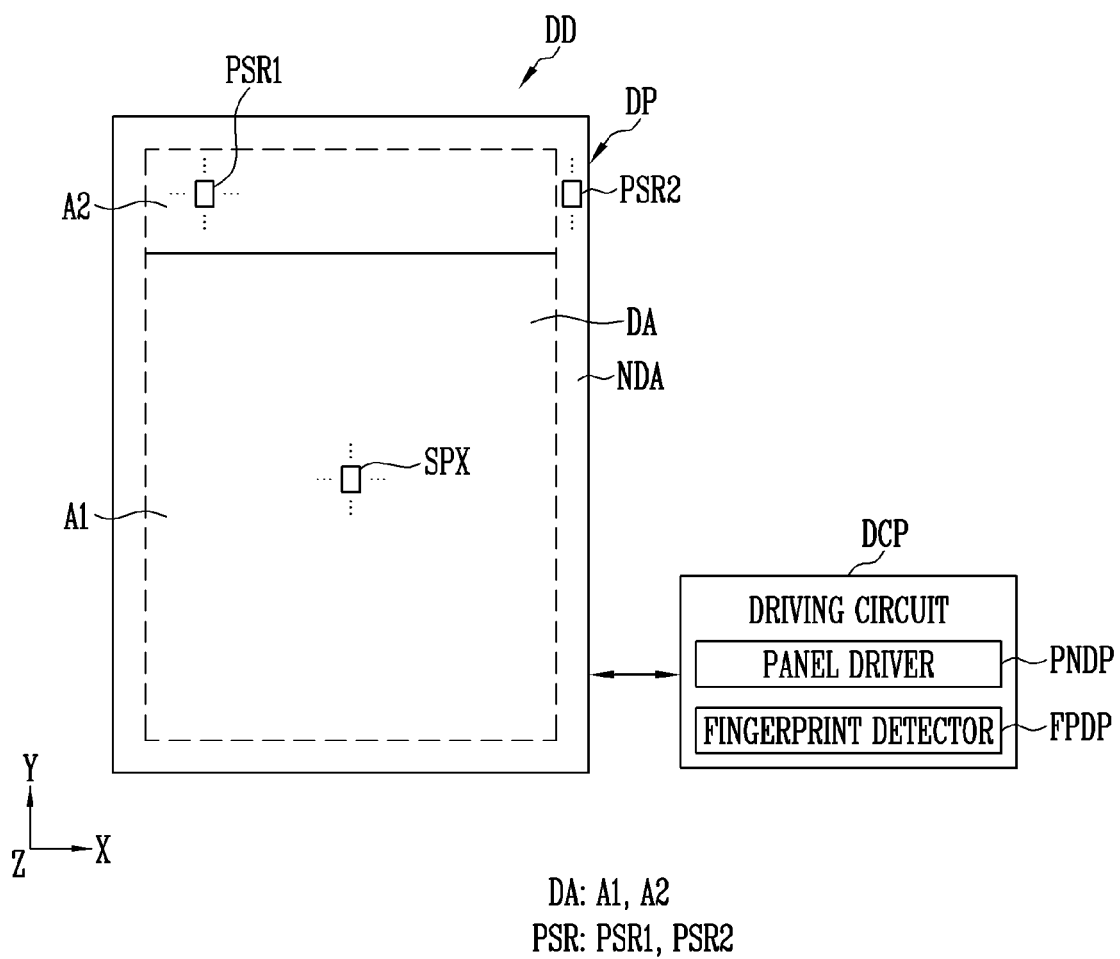
FIGS. 1 and 2 are plan views illustrating a display device in accordance with an embodiment of the present disclosure.

The terminology used herein is for the purpose of describing particular embodiments only and is not construed as limiting the inventive concept. As used herein, the singular forms are intended to include the plural forms as well, unless the context clearly indicates otherwise. The terms "comprises/includes" and/or "comprising/including," when used in this specification, specify the presence of mentioned component, step, operation and/or element, but do not exclude the presence or addition of one or more other components, steps, operations and/or elements.

When described as that any element is "connected", "coupled" or "accessed" to another element, it should be understood that it is possible that still another element may "connected", "coupled" or "accessed" between the two elements as well as that the two elements are directly "connected", "coupled" or "accessed" to each other.

The term "on" that is used to designate that an element or layer is on another element or layer includes both a case where an element or layer is located directly on another element or layer, and a case where an element or layer is located on another element or layer via still another element layer. Like reference numerals generally denote like elements throughout the specification.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the present disclosure.

Hereinafter, exemplary embodiments of the present disclosure will be described in more detail with reference to the accompanying drawings.

Figure 2:
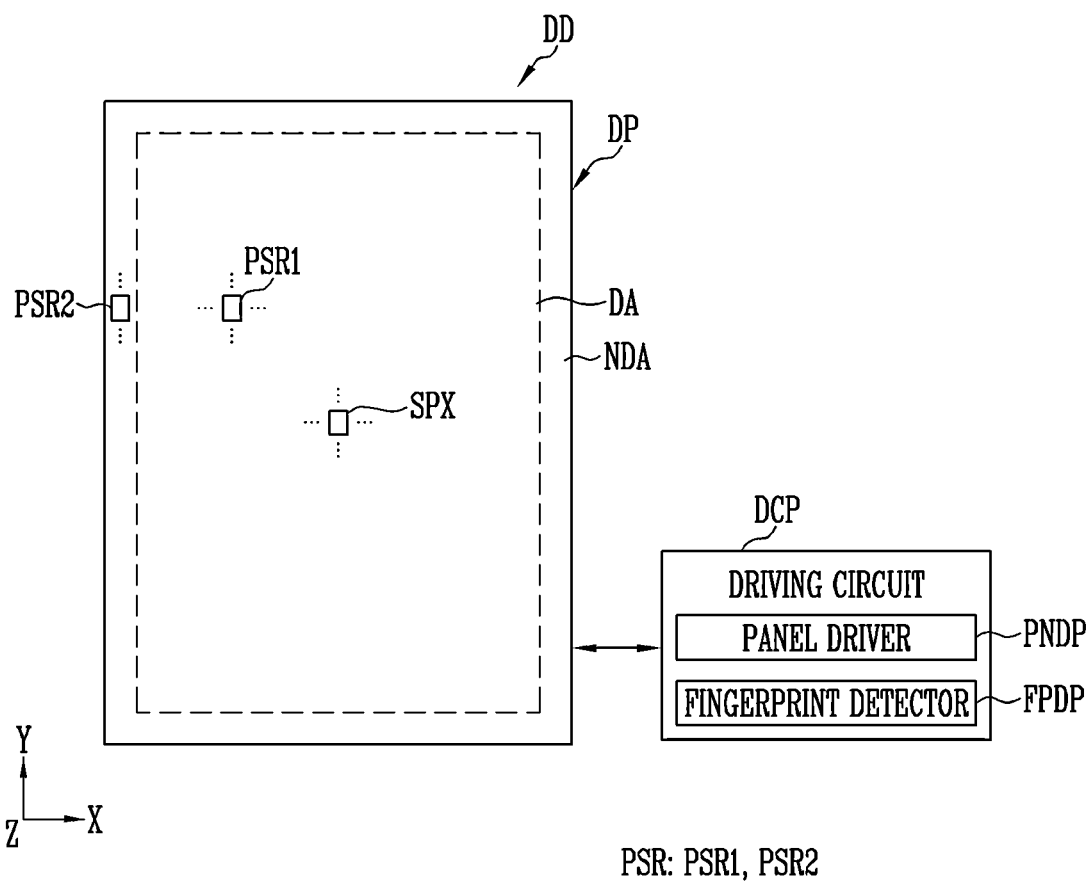

FIGS. 1 and 2 are plan views illustrating an embodiment of a display device DD which includes a display panel DP and a driving circuit DCP for driving the display panel DP. For convenience of description, a case where the display panel DP and the driving circuit DCP are separated from each other is illustrated in FIGS. 1 and 2. However, the present disclosure is not necessarily limited thereto. In some embodiments, all or a portion of the driving circuit DCP may be integrally implemented with the display panel DP.

Referring to FIGS. 1 and 2, as indicated above, the display device DD may include a display panel DP and a driving circuit DCP. The display device DD may have various predetermined shapes. For example, the display device DD may have a rectangular plate shape having two pairs of sides parallel to each other. In the drawings, an extending direction of long sides is designated as a second direction (Y-axis direction), and an extending direction of short sides is designated as a first direction (X-axis direction). In some embodiments, in the display device DD provided in the rectangular plate shape, a corner at which one long side and one short side are in contact with each other may have a round shape. However, the present disclosure is not necessarily limited thereto. In other embodiments, the display device DD may have a shape different from a rectangular shape, e.g., the display device may have a circular shape or another shape.

In accordance with an embodiment, at least a portion of the display device DD be at least partially flexible. In this case, the display device DD may be folded at a portion that has flexibility.

The display device DD may be formed as various types of electronic devices. For example, the display device DD may be a flexible display device, a curved display device, a foldable display device, or a bendable display device. Also, the display device DD may be formed as a transparent display device, a head-mounted display device, a wearable display device, or another type of device.

The display panel DP may include a display area DA and a non-display area NDA. Sub-pixels SPX may be provided in the display area DA to emit light to display an image. The non-display area NDA may be located at a periphery of the display area DA. For example, the non-display area NDA may be formed to surround the display area DA.

A plurality of sub-pixels SPX may be provided in the display area DA. The sub-pixels SPX may be regularly arranged according to a stripe arrangement structure, a PENTILE™ arrangement structure, or another predetermined arrangement. However, the arrangement structure of the sub-pixels SPX is not limited thereto, and the sub-pixels SPX may be arranged in the display area DA using various other structures and/or methods.

Each pixel of the display area DA may include a plurality of sub-pixels. The sub-pixels SPX may respectively emit light of different colors. In an example, the sub-pixels SPX may respectively include a first sub-pixel emitting light of a first color, a second sub-pixel emitting light of a second color, and a third sub-pixel emitting light of a third color. In an example, the first sub-pixel may be a red pixel emitting light of red, the second sub-pixel may be a green pixel emitting light of green, and the third sub-pixel may be a blue pixel emitting light of blue. However, the colors, kinds, and/or numbers of the sub-pixels SPX are not necessarily limited thereto, and the colors of light which the sub-pixels SPX emit may be vary among different embodiments.

Figure 4:
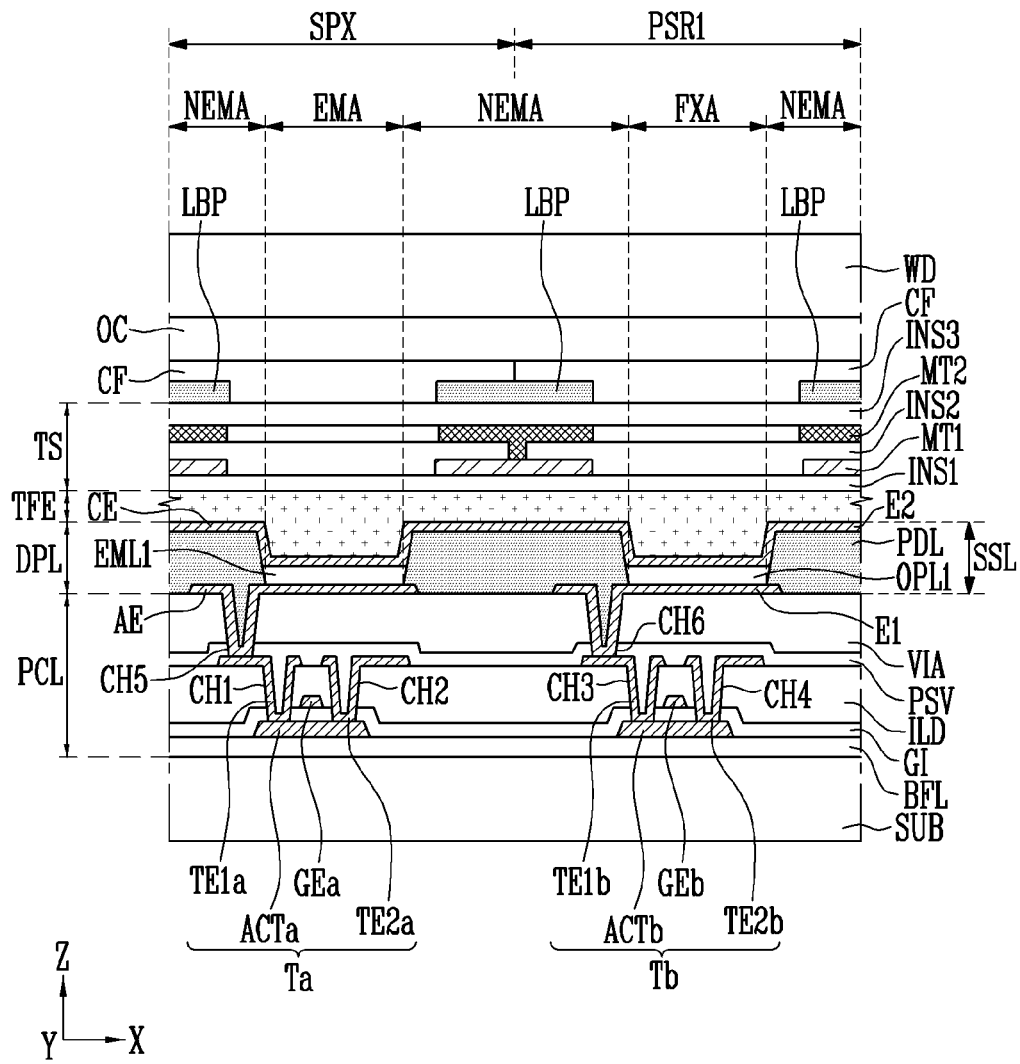
FIGS. 4 and 5 are sectional views illustrating a display panel in accordance with an embodiment of the present disclosure.

In some embodiments, each of the sub-pixels SPX may include at least one light emitting element (e.g., LD1 shown in FIG. 4). In some embodiments, a first light emitting element LD1 may include an organic light emitting diode or subminiature inorganic light emitting diodes having a size in a range of micrometer scale to nanometer scale. However, the present disclosure is not necessarily limited thereto. The display device DD may drive the sub-pixels SPX, corresponding to input image to thereby display an image in the display area DA.

The non-display area NDA partially or entirely surrounds the display area DA, and may correspond to a remaining area of the display device except for the display area DA. The non-display area NDA may include, for example, a line area, a pad area, and/or various dummy areas.

In addition to the subpixels, the display area DA may include a plurality of light sensing pixels. For example, a plurality of first light sensing pixels PSR1 capable of sensing a fingerprint of a user, or the like, may be disposed in the display area DA. In one embodiment, the first light sensing pixels PSR1 are disposed in the display area DA, so that the fingerprint of the user can be sensed in an area in which an image is viewed.

As shown in FIG. 1, when the display area DA is divided to include a first area A1 and a second area A2, the first light sensing pixels PSR1 may be disposed in only a partial area the display area DA. For example, a case where the first light sensing pixels PSR1 are disposed in only the second area A2 is exemplified in FIG. 1. However, the present disclosure is not necessarily limited thereto. In some embodiments, the first light sensing pixels PSR1 may be disposed in only the first area A1. In one embodiment, as shown in FIG. 2, the first light sensing pixels PSR1 may be distributed throughout the entire display area DA, while being spaced apart from each other. The manner in which the first light sensing pixels PSR1 are disposed in the display area DA may be different among various embodiments.

In an embodiment, the first light sensing pixels PSR1 may sense that light emitted from a light source is reflected by a finger of a user, a stylus, or another object. For example, a fingerprint of the user may be sensed through the first light sensing pixels PSR1. Hereinafter, a case where the first light sensing pixels PSR1 are used for fingerprint sensing will be mainly described. However, the present disclosure is not necessarily limited thereto. For example, the first light sensing pixels PSR1 may sense various types of biometric information, including but not limited to irises and veins. Also, the first light sensing pixels PSR1 may sense external light, and may operate, for example, as a gesture sensor, a motion sensor, a proximity sensor, an illuminance sensor, an image sensor, or another type of sensor.

The display device DD may also include second light sensing pixels PSR2. The second light sensing pixels PSR2 may be disposed in the display area DA and/or the non-display area NDA. For example, in one embodiment, the second light sensing pixels PSR2 may be located in a non-emission area of the display area DA or in the non-display area NDA, but the present disclosure is not limited thereto. The uniformity of the first light sensing pixels PSR1 can be improved through calibration using the second light sensing pixels PSR2. The driving circuit DCP may drive the display panel DP. For example, the driving circuit DCP may output a data signal corresponding to image data to the display panel DP, and/or output a signal for light sensing pixels PSR and electrical signals (e.g., sensing signals) received from the light sensing pixels PSR. The driving circuit DCP may detect a fingerprint form of a user based on the received electrical signals.

In some embodiments, the driving circuit DCP may include a panel driver PNDP and a fingerprint detector FPDP (or sensor driver). For convenience of description, a case where the panel driver PNDP and the fingerprint detector FPDP are separated from each other is illustrated in FIGS. 1 and 2. However, the present disclosure is not necessarily limited thereto. For example, at least a portion of the fingerprint detector FPDP may be integrated together with the panel driver PNDP, or may be operated in an interlocking or cooperative manner with the panel driver PNDP.

The panel driver PNDP may supply a data signal corresponding to an image data signal to the sub-pixels SPX of the display area DA, while sequentially scanning the sub-pixels SPX. Accordingly, the display panel DP can display an image corresponding to image data.

The panel driver PNDP may supply a signal for fingerprint sensing to the sub-pixels SPX. The signal may be provided to allow the sub-pixels to emit light, thereby being operated as a light source for fingerprint input sensing of the first light sensing pixels PSR1. Also, the panel driver PNDP may supply a signal for fingerprint sensing to the first light sensing pixels PSR1. Also, the panel driver PNDP may supply a signal for calibration to the second light sensing pixels PSR2. As explained in greater detail below, this may involve the panel driver PNDP sending a signal to the second light sensing pixels PSR2, and more specifically to the light receiving element OPD2 of the second light sensing pixels PSR2, to generate correction data. During this process, external light may be blocked from being received by the second light sensing pixels PSR2. The correction data generated may then be used as a basis for calibrating the first light sensing pixels PSR1 in a manner which improves the accuracy of fingerprint detection. However, the present disclosure is not necessarily limited thereto, and signals for fingerprint sensing or calibration may be provided by the fingerprint detector FPDP, for example, as shown in FIG. 2.

The fingerprint detector FPDP may detect biometric information (such as a user fingerprint) based on signals received from the first light sensing pixels PSR1. Also, the fingerprint detector FPDP may generate correction data based on signals received from one or more of the second light sensing pixels PSR2, and may apply an offset to the first light sensing pixels PSR1 based on the correction data.

Figure 3:
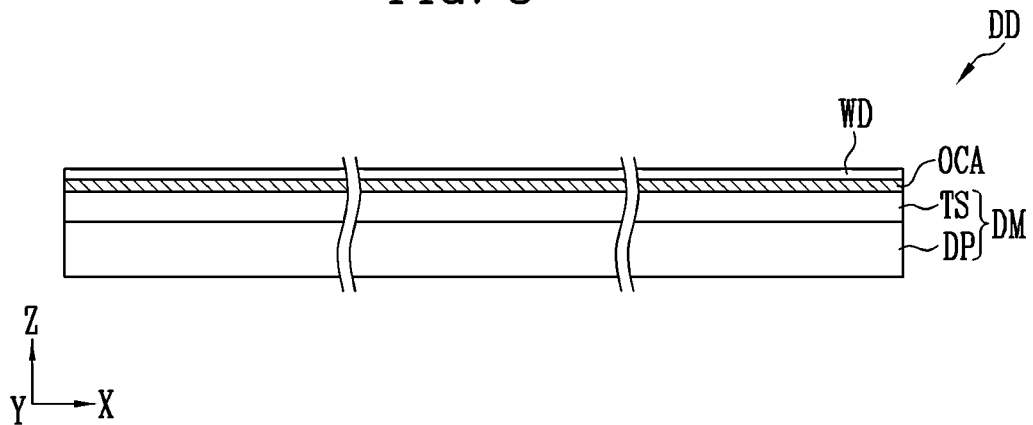
FIG. 3 is a sectional view illustrating a display device in accordance with an embodiment of the present disclosure.

FIG. 3 is a sectional view illustrating the display device DD in accordance with an embodiment of the present disclosure.

Referring to FIG. 3, the display device DD may include a display module DM and a window WD. The display module DM may include a display panel DP and a touch sensing layer TS. The touch sensing layer TS may be disposed directly on the display panel DP, or may be disposed on the display panel DP with a separate or intervening layer such as an adhesive layer or a substrate (or insulating layer) interposed therebetween.

The display panel DP may display an image. A self-luminescent display panel such as, but not limited to, an Organic Light Emitting Display panel (OLED panel) may be used as the display panel DP. In addition, a non-self-luminescent display panel may be used as the display panel DP. Examples include a Liquid Crystal Display panel (LCD panel), an Electro-Phoretic Display panel (EPD panel), and an Electro-Wetting Display panel (EWD panel). When a non-self-luminescent display panel is used as the display panel DP, the display device DD may include a backlight unit which supplies light to the display panel DP. Hereinafter, for illustrative purposes, an embodiment in which the display panel DP includes an organic light emitting display panel will be mainly described.

The touch sensing layer TS may be disposed on a surface from which light of an image of the display panel DP is emitted, and may operate to receive a touch input of a user. The touch sensing layer TS may acquire information on the touch input. For example, the touch sensing layer TS may recognize a touch event of the display device DD through a hand of the user or a separate input means. For example, the touch sensing layer TS may recognize a touch event in a capacitive or a resistive manner, but the present disclosure is not necessarily limited thereto. In one embodiment, the touch sensing layer TS may sense a touch input in a mutual capacitance manner or may sense the touch input in a self-capacitance manner.

The window WD may be provided on the display module DM. The window WD may protect the display module DM from external impact, and provide an input surface and/or a display surface to the user. The window WD may be coupled to the display module DM, for example, using an optically clear adhesive member OCA. In some embodiments, the window WD may have a substrate or film structure. The window WD may have a single-layer structure or a multi-layer structure. All or a portion of the window WD may have flexibility.

Figure 5:
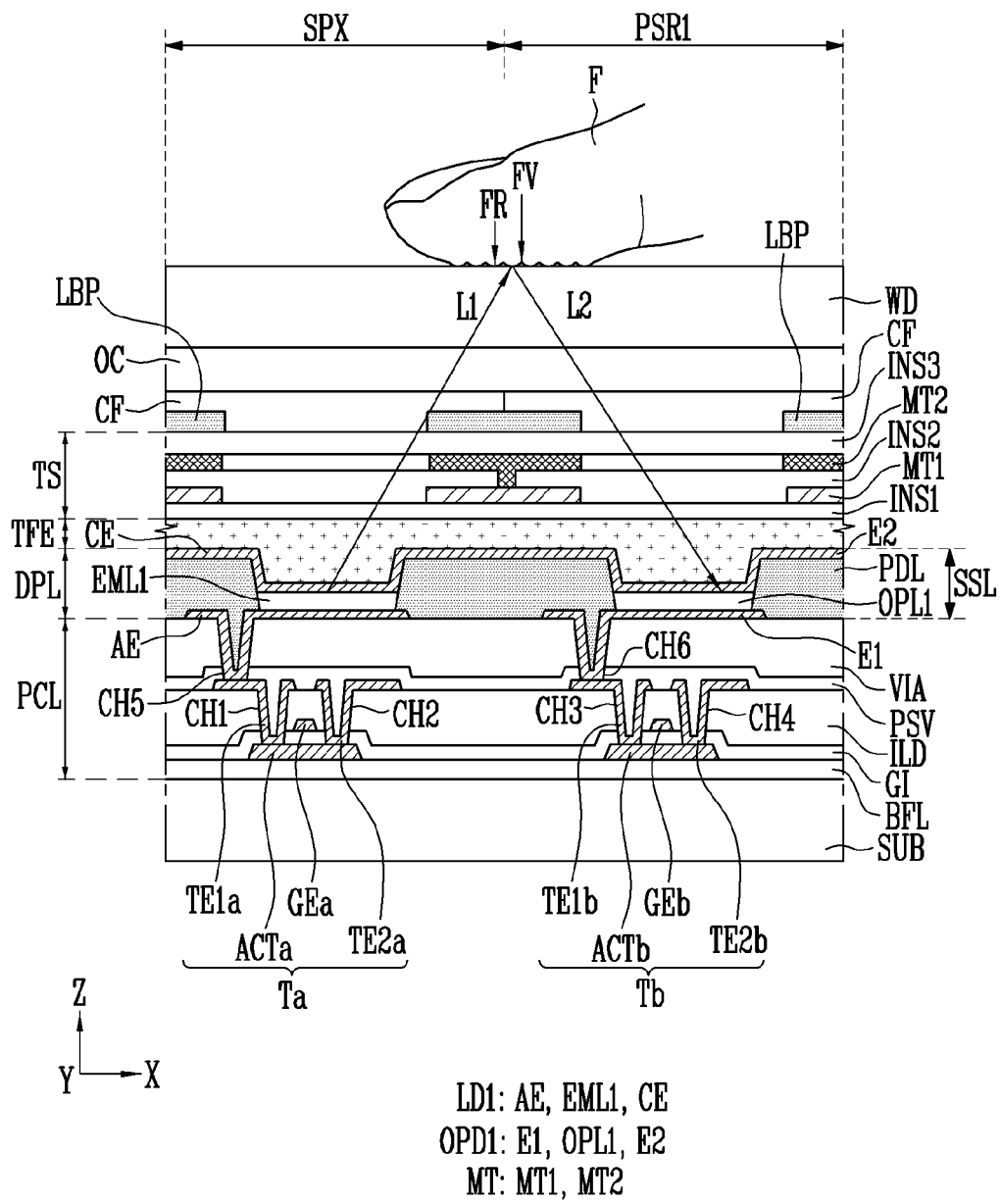

FIGS. 4 and 5 are sectional views illustrating a display panel in accordance with an embodiment of the present disclosure. The display panel may, for example, be the display panel DP of the display device shown in FIGS. 1 to 3. FIG. 4 illustrates a section of a sub-pixel SPX and a first light sensing pixel PSR1. FIG. 5 illustrates a reflection path of light in the display device shown in FIG. 4.

Referring to FIGS. 4 and 5, the sub-pixel SPX may include an emission area EMA, and the first light sensing pixel PSR1 may include light receiving area FXA. A non-emission area NEMA may be located between the emission area EMA and the light receiving area FXA.

The sub-pixel SPX may include a pixel circuit layer PCL, a display element layer DPL, and a thin film encapsulation layer TFE, which are sequentially disposed on a substrate SUB. The first light sensing pixel PSR1 may include the pixel circuit layer PCL, the display element layer DPL, and the thin film encapsulation layer TFE, which are sequentially disposed on the substrate SUB.

The substrate SUB may form a base surface and may include a transparent insulating material to enable light to be transmitted therethrough. The substrate SUB may be a rigid substrate or a flexible substrate. The rigid substrate may be, for example, one of a glass substrate, a quartz substrate, a glass ceramic substrate, or a crystalline glass substrate. The flexible substrate may be one of a film substrate or a plastic substrate, which, for example, may include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate, but the present disclosure is not necessarily limited thereto.

The pixel circuit layer PCL may include a pixel circuit provided on the substrate SUB. The pixel circuit layer PCL may include a sensor circuit provided on the substrate SUB. In one embodiment, the pixel circuit layer PCL may include a buffer layer BFL, a gate insulating layer GI, an interlayer insulating layer ILD, a passivation layer PSV, and a via layer VIA, which are sequentially stacked on the substrate SUB along a third direction (Z-axis direction).

The buffer layer BFL may be an inorganic insulating layer including an inorganic material. For example, the buffer layer BFL may include at least one of silicon nitride ($SiN_x$), silicon oxide ($SiO_x$), silicon oxynitride ($SiO_xN_y$), or metal oxide such as aluminum oxide ($AlO_x$). The buffer layer BFL may be provided as a single layer, but be provided as a multi-layer including at least two layers in other embodiments. When the buffer layer BFL is provided as a multi-layer, the layers may be formed of the same material or of different materials. In one embodiment, the buffer layer BFL may be omitted according to a material of the substrate SUB, process conditions, or the like.

A first transistor Ta of the sub-pixel SPX and a second transistor Tb of the first light sensing pixel PSR1 may be disposed on the buffer layer BFL. The first transistor Ta may include a first active pattern ACTa, a first gate electrode GEa, a first transistor electrode TE1a, and a second transistor electrode TE2a. The second transistor Tb may include a second active pattern ACTb, a second gate electrode GEb, a first transistor electrode TE1b, and a second transistor electrode TE2b.

The first active pattern ACTa and the second active pattern ACTb may be disposed on the buffer layer BFL. In one embodiment, the first active pattern ACTa and the second active pattern ACTb may include a poly-silicon semiconductor. For example, the first active pattern ACTa and the second active pattern ACTb may be formed through a low temperature poly-silicon (LTPS) process. However, the present disclosure is not necessarily limited thereto. In other embodiments, the first active pattern ACTa and the second active pattern ACTb may be formed of an oxide semiconductor, a metal oxide semiconductor, or another material.

Each of the first active pattern ACTa and the second active pattern ACTb may include a channel region, a first contact region in contact with one end of the channel region, and a second contact region in contact with the other end of the channel region. The channel region, the first contact region, and the second contact region may be formed of a semiconductor layer undoped or doped with an impurity. In an example, the first contact region and the second contact region may be formed of a semiconductor layer doped with the impurity, and the channel region may be formed of a semiconductor layer undoped with the impurity. In an example, a p-type impurity may be used as the impurity, but the present disclosure is not limited thereto. In another embodiment, an n-type impurity may be used as the impurity. One of the first and second contact regions may be a source region, and the other of the first and second contact regions may be a drain region.

The gate insulating layer GI may be disposed over the first active pattern ACTa and the second active pattern ACTb. The gate insulating layer GI may be an inorganic layer (or inorganic insulating layer) including an inorganic material. In an example, the gate insulating layer GI may include at least one of silicon nitride ($SiN_x$), silicon oxide ($SiO_x$), silicon oxynitride ($SiO_xN_y$), or metal oxide such as aluminum oxide ($AlO_x$). However, the material of the gate insulating layer GI is not limited to the above-described embodiments. In some embodiments, the gate insulating layer GI may be provided as an organic layer (or organic insulating layer) including an organic material. The gate insulating layer GI may be provided as a single layer, but be provided as a multi-layer including at least two layers in other embodiments.

The first gate electrode GEa and the second gate electrode GEb may be disposed on the gate insulating layer GI. The first gate electrode GEa may overlap with the channel region of the first active pattern ACTa, and the second gate electrode GEb may overlap with the channel region of the second active pattern ACTb.

The first gate electrode GEa and the second gate electrode GEb may be formed as a single layer including one or more of copper (Cu), molybdenum (Mo), tungsten (W), aluminum neodymium (AlNd), titanium (Ti), aluminum (Al), silver (Ag), or any alloy thereof or a mixture thereof, or may be formed in a double- or multi-layered structure including, for example, molybdenum (Mo), titanium (Ti), copper (Cu), aluminum (Al) or silver (Ag), which is a low-resistance material that may decrease wiring resistance.

The interlayer insulating layer ILD may be disposed over the first gate electrode GEa and the second gate electrode GEb. The interlayer insulating layer ILD may include the same material as the gate insulating layer GI, or may include at least one material selected from the materials used to form the gate insulating layer GI.

The first transistor electrodes TE1a and TE1b and the second transistor electrodes TE2a and TE2b may be disposed on the interlayer insulating layer ILD. The first transistor electrode TE1a of the first transistor Ta may be in contact with the first contact region of one end of the first active pattern ACTa, through a first contact hole CH1 penetrating the interlayer insulating layer ILD and the gate insulating layer GI. When the first contact region is a source region, the first transistor electrode TE1a may be a first source electrode.

The second transistor electrode TE2a of the first transistor Ta may be in contact with the second contact region of the other end of the first active pattern ACTa, through a second contact hole CH2 penetrating the interlayer insulating layer ILD and the gate insulating layer GI. When the second contact region is a drain region, the second transistor electrode TE2a may be a second drain electrode.

The first transistor electrode TE1b of the second transistor Tb may be in contact with the first contact region of one end of the second active pattern ACTb through a third contact hole CH3 penetrating the interlayer insulating layer ILD and the gate insulating layer GI. When the first contact region is a source region, the first transistor electrode TE1b may be a second source electrode.

The second transistor electrode TE2b of the second transistor Tb may be in contact with the second contact region of the other end of the second active pattern ACTb through a fourth contact hole CH4 penetrating the interlayer insulating layer ILD and the gate insulating layer GI. When the second contact region is a drain region, the second transistor electrode TE2b may be a second drain electrode.

The first transistor electrodes TE1a and TE1b and the second transistor electrodes TE2a and TE2b may respectively include the same materials as the first and second gate electrodes GEa and GEb, or may respectively include one or more material selected from the material used to form the first and second gate electrodes GEa and GEb.

The passivation layer PSV may be disposed over the first transistor electrodes TE1a and TE1b and the second transistor electrodes TE2a and TE2b. The passivation layer PSV (e.g., a protective layer) may be an inorganic layer (or inorganic insulating layer) including an inorganic material, or an organic layer (or organic insulating layer) including an organic material. The inorganic layer may include, for example, at least one of silicon oxide ($SiO_x$), silicon nitride ($SiN_x$), silicon oxynitride ($SiO_xN_y$), or a metal oxide such as, but not limited to, aluminum oxide ($AlO_x$). The organic layer may include, for example, at least one of acrylic resin, epoxy resin, phenolic resin, polyamide resin, polyimide resin, unsaturated polyester resin, poly-phenylene ether resin, poly-phenylene sulfide resin, or benzocyclobutene resin.

In some embodiments, the passivation layer PSV may include the same material as the interlayer insulating layer ILD, but the present disclosure is not limited thereto. The passivation layer PSV may be provided as a single layer, but be provided as a multi-layer including at least two layers in another embodiment.

The via layer VIA may be disposed on the passivation layer PSV. The via layer VIA may include the same material as the passivation layer PSV, or may include at least one material used to form the passivation layer PSV. In an embodiment, the via layer VIA may be an organic layer made of an organic material.

The display element layer DPL and a sensor layer SSL may be disposed on the pixel circuit layer PCL, for example, in a same plane. The display element layer DPL may include a first light emitting element LD1 emitting light which may include an anode electrode AE, a first light emitting layer EML1, and a cathode electrode CE. The first light emitting element LD1 may be, for example, a top emission organic light emitting element.

The anode electrode AE may be electrically connected to the first transistor electrode TE1a of the first transistor Ta through a fifth contact hole CH5 that penetrates the via layer VIA and the passivation layer PSV.

A bank PDL may be disposed on the anode electrode AE. The bank PDL may define (or partition) the emission area of the sub-pixel SPX. The bank PDL may include an opening partially exposing the anode electrode AE.

The bank PDL may be an organic insulating layer made of an organic material. The organic material may include acrylic resin, epoxy resin, phenolic resin, polyamide resin, polyimide resin, or another material. In some embodiments, the bank PDL may include a light absorption material or may have a light absorber coated thereon, in order to absorb external light. For example, the bank PDL may include a carbon-based black pigment. However, the present disclosure is not necessarily limited thereto, and the bank PDL may include an opaque metal material such as, but not limited to, chromium (Cr), molybdenum (Mo), an alloy (MoTi) of molybdenum and titanium, tungsten (W), vanadium (V), niobium (Nb), tantalum (Ta), manganese (Mn), cobalt (Co) or nickel (Ni), which has a high light absorption rate.

The first light emitting layer EML1 may be disposed on the anode electrode AE exposed by the bank PDL. The cathode electrode CE may be disposed over the first light emitting layer EML1.

The sensor layer SSL of the first light sensing pixel PSR1 may include a first light receiving element OPD1 that is positioned to receive light. The first light receiving element OPD1 may be an optical-type fingerprint sensor. In an example, the first light receiving element OPD1 may include one or more of an organic photodetector, a photo diode, a CMOS image sensor, a CCD camera, or a photo transistor, but may include a different material in other embodiments.

The first light receiving element OPD1 may sense light reflected by ridges FR and valleys FV between the ridges FR, to thereby recognize a fingerprint. For example, when a finger F of a user comes into contact with a window WD, first light L1 output from the first light emitting element LD1 may be reflected by a ridge FR or valley FV of the finger F. The reflected second light L2 may reach the first light receiving element OPD1 of the sensor layer SSL. The first light receiving element OPD1 may distinguish second light L2 reflected by the ridge FR of the finger F from second light L2 reflected from the valley FV of the finger F. When taken with reflected light sensed by other fingerprint sensors, a pattern of the fingerprint of the user may be determined.

The first light receiving element OPD1 may include a first electrode E1, a first light receiving layer OPL1 (or photoelectric conversion layer), and a second electrode E2. The first electrode E1 may be electrically connected to the first transistor electrode TE1b of the second transistor Tb through a sixth contact hole CH6 penetrating the via layer VIA and the passivation layer PSV.

The first electrode E1 may be disposed, for example, in the same layer as the above-described anode electrode AE. The first electrode E1 and the anode electrode AE may be simultaneously formed by the same process, but may be formed by different processes in another embodiment.

Each of the anode electrode AE and the first electrode E1 may be made of a metal layer, including but not limited to silver (Ag), magnesium (Mg), aluminum (Al), platinum (Pt), palladium (Pd), gold (Au), nickel (Ni), neodymium (Nd), iridium (Ir), chromium (Cr), alloys thereof, or the like, and/or a transparent conductive layer including indium tin oxide (ITO), indium zinc oxide (IZO), zinc oxide (ZnO), indium tin zinc oxide (ITZO) or another material.

The bank PDL may be disposed on the first electrode E1 and may define (or partition) the light receiving area FXA of the first light sensing pixel PSR1. The bank PDL may include an opening partially exposing the first electrode E1.

The first light receiving layer OPL1 may be disposed on the first electrode E1 exposed by the bank PDL. The first light receiving layer OPL1 may be disposed, for example, in the same layer as the above-described first light emitting layer EML1. The first light receiving layer OPL1 may be made of an organic photosensitive material. For example, the organic photosensitive material may include one or more of a dithiolene-based material (BDN) (Bis(4-dimethyl-amino-dithiobenzil)nickel(II)), a benzotriazole-based compound (PTZBTTT-BDT), a porphyrin-based small molecule material (DHTBTEZP), or another material.

The second electrode E2 may be disposed over the first light receiving layer OPL1. The second electrode E2 may be disposed in the same layer as the above-described cathode electrode CE. The second electrode E2 and the cathode electrode CE may be simultaneously formed through the same process. In an example, the second electrode E2 and the cathode electrode CE may be provided as a common electrode, but the present disclosure is not necessarily limited thereto. For example, the second electrode E2 and the cathode electrode CE may be formed at different times and/or by different processes in another embodiment.

Each of the cathode electrode CE and the second electrode E2 may be made of a metal layer including, for example, one or more of silver (Ag), magnesium (Mg), aluminum (Al), platinum (Pt), palladium (Pd), gold (Au), nickel (Ni), neodymium (Nd), iridium (Ir), chromium (Cr), alloys thereof, or the like, and/or a transparent conductive layer including indium tin oxide (ITO), indium zinc oxide (IZO), zinc oxide (ZnO), indium tin zinc oxide (ITZO), or another material. In some embodiments, each of the cathode electrode CE and the second electrode E2 may be provided as a multi-layer including at least two layers, which includes a metal thin layer.

The thin film encapsulation layer TFE may be disposed on the display element layer DPL and the sensor layer SSL. The thin film encapsulation layer TFE may have a single-layer structure or a multi-layer structure. The thin film encapsulation layer TFE may include a plurality of insulating layers covering the first light emitting element LD1 and the first light receiving element OPD1. In one embodiment, the thin film encapsulation layer TFE may include at least one inorganic layer and at least one organic layer. For example, the thin film encapsulation layer TFE may have a structure in which an inorganic layer and an organic layer are alternately stacked. In some embodiments, the thin film encapsulation layer TFE may be an encapsulation substrate disposed on the first light emitting element LD1 and the first light receiving element OPD1. The thin film encapsulation layer TFE may be bonded to the substrate SUB, for example, using a sealant.

A touch sensing layer TS may be disposed on the thin film encapsulation layer TFE. The touch sensing layer TS may include a first insulating layer INS1, a first sensing conductive layer MT1, a second insulating layer INS2, a second sensing conductive layer MT2, and/or a third insulating layer INS3.

The first insulating layer INS1 may include an inorganic insulating layer including an inorganic material or an organic insulating layer including an organic material. The inorganic insulating layer may include, for example, an inorganic insulating material such as, but not limited to, silicon oxide ($SiO_x$), silicon nitride ($SiN_x$), silicon oxynitride ($SiO_xN_y$), aluminum oxide ($AlO_x$), titanium oxide ($TiO_x$), tantalum oxide ($Ta_xO_y$), hafnium oxide ($HfO_x$), or zinc oxide ($ZnO_x$). The organic insulating layer may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin, but the present disclosure is not necessarily limited thereto. In some embodiments, the first insulating layer INS1 may be omitted or may be configured as an uppermost layer of the thin film encapsulation layer.

The first sensing conductive layer MT1 may be disposed on the first insulating layer INS1. The first sensing conductive layer MT1 may be partially opened so that it does not overlap with the first light emitting element LD1. An opening of the first sensing conductive layer MT1 may provide an optical path, such that the first light L1 emitted from the first light emitting element LD1 can advance upwardly from the display device DD, as shown, for example, in FIG. 5. In one embodiment, the opening of the first sensing conductive layer MT1 may be formed to overlap with at least a portion of the first light emitting element LD1. In an example, the first sensing conductive layer MT1 may be disposed to overlap with the non-emission area NEMA at the periphery of the emission area EMA.

Also, the first sensing conductive layer MT1 may be partially opened so that it does not overlap with the first light receiving element OPD1. An opening of the first sensing conductive layer MT1 may provide an optical path, such that the second light L2 reflected from the fingerprint of the finger F of the user can advance toward and be received by the first light receiving element OPD1, as shown, for example, in FIG. 5. To this end, the opening of the first sensing conductive layer MT1 may be disposed to partially overlap with the first light receiving element OPD1. In an example, the first sensing conductive layer MT1 may be disposed to overlap with the non-emission area NEAM at the periphery of the light receiving area FXA.

The first sensing conductive layer MT1 may include a metal layer or a transparent conductive layer. For example, the metal layer may include one or more of molybdenum, titanium, copper, aluminum, or alloys thereof. The transparent conductive layer may include one of indium tin oxide (ITO), indium zinc oxide (IZO), zinc oxide (ZnO), indium tin zinc oxide (ITZO), PEDOT, or a metal nano wire, but the present disclosure is not necessarily limited thereto. The first sensing conductive layer MT1 may form a connection electrode connecting sensing electrodes to each other. This will be described in detail later with reference to FIGS. 12 to 14.

The second insulating layer INS2 may be disposed over the first sensing conductive layer MT1. The second insulating layer INS2 may include, for example, the same material as the above-described first insulating layer INS1, or may include at least one material used to form the first insulating layer INS1.

The second sensing conductive layer MT2 may be disposed on the second insulating layer INS2. The second sensing conductive layer MT2 may be partially opened so that it does not overlap with the first light emitting element LD1. An opening of the second sensing conductive layer MT2 may provide an optical path that allows the first light L1 emitted from the first light emitting element LD1 to advance upwardly from the display device DD, as shown, for example, in FIG. 5. In one embodiment, the opening of the second sensing conductive layer MT2 may be formed to partially overlap with the first light emitting element LD1. In an example, the second sensing conductive layer MT2 may be disposed to overlap with the non-emission area NEMA at the periphery of the emission area EMA.

Also, the second sensing conductive layer MT2 may be partially opened so that it does not overlap with all or a portion of the first light receiving element OPD1. An opening of the second sensing conductive layer MT2 may provide an optical path, to allow the second light L2 reflected from the fingerprint of the finger F of the user to advance toward and be received by the first light receiving element OPD1. In one embodiment, the opening of the second sensing conductive layer MT2 may be disposed to overlap with the first light receiving element OPD1. In an example, the second sensing conductive layer MT2 may be disposed to overlap with the non-emission area NEMA at the periphery of the light receiving area FXA.

The second sensing conductive layer MT2 may include the same material as the above-described first sensing conductive layer MT1, or may include a different material. In one embodiment, the second sensing conductive layer MT2 may include at least one material used to form the first sensing conductive layer MT1.

As shown in FIGS. 4 and 5, the second sensing conductive layer MT2 may be electrically connected to the first sensing conductive layer MT1 through a contact hole penetrating the second insulating layer INS2. The second sensing conductive layer MT2 may form sensing electrodes. Embodiments will be described in detail later with reference to FIGS. 12 to 14.

The third insulating layer INS3 may be disposed over the second sensing conductive layer MT2 and may include an organic layer, but the present disclosure is not necessarily limited thereto. In some embodiments, the third insulating layer INS3 may be configured as an inorganic layer, or may have a structure in which an organic layer and an inorganic layer are alternatively stacked.

A light blocking layer LBP may be disposed on the touch sensing layer TS. The light blocking layer LBP may be partially opened so that it does not overlap with the first light emitting element LD1. An opening of the light blocking layer LBP may provide an optical path that allows the first light L1 emitted from the first light emitting element LD1 to advance upwardly from the display device DD. In one embodiment, the opening of the light blocking layer LBP may be formed to overlap with the first light emitting element LD1. In an example, the light blocking layer LBP may be disposed to overlap with the non-emission area NEMA at the periphery of the emission area EMA.

Also, the light blocking layer LBP may be partially opened so that it does not overlap with the first light receiving element OPD1. An opening of the light blocking layer LBP may provide an optical path to allow the second light L2 reflected from the fingerprint of the finger F of the user to advance toward the first light receiving element OPD1, as shown, for example, in FIG. 5. In one embodiment, the opening of the light blocking layer LBP may be disposed to overlap with the first light receiving element OPD1. In an embodiment, the light blocking layer LBP may be disposed to overlap with the non-emission area NEMA at the periphery of the light receiving area FXA.

The light blocking layer LBP may include a light blocking material so as to prevent light leakage and color mixture. In an example, the light blocking layer LBP may include a black matrix, but the present disclosure is not necessarily limited thereto. In some embodiments, the light blocking layer LBP may include a carbon black (CB) and/or a titan black (TiBK).

A color filter CF may be disposed over the light blocking layer LBP. The color filter CF may be disposed to overlap with the first light emitting element LD1 of the sub-pixel SPX in the opening of the light blocking layer LBP. Also, the color filter CF may be disposed to overlap with the first light receiving element OPD1 of the first light sensing pixel PSR1 in the opening of the light blocking layer LBP. The color filter CF may include a color filter material corresponding to a color of each sub-pixel SPX and/or the first light sensing pixel PSR1.

An overcoat layer OC may be disposed on the color filter CF. The overcoat layer OC may be provided throughout the sub-pixel SPX and the first light sensing pixel PSR1. The overcoat layer OC may prevent moisture or air from infiltrating into the various lower-positioned elements of the sub-pixels and first light sensing pixels PSR1. Also, the overcoat layer OC may protect the lower elements from a foreign matter such as dust.

The overcoat layer OC may include an organic material such as, but not limited to, acryl resin, epoxy resin, phenolic resin, polyamide resin, polyimide resin, unsaturated polyester resin, poly-phenylene ether resin, poly-phenylene sulfide resin, or benzocyclobutene (BCB). However, the present disclosure is not necessarily limited thereto, and the overcoat layer OC may include various kinds of inorganic insulating materials, including, but not limited to, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The window WD may be provided on the overcoat layer OC. The window WD may protect the lower elements from external impact, and may provide an input surface and/or a display surface to the user.

FIGS. 6 to 11 are sectional views illustrating a display panel in accordance with an embodiment of the present disclosure. In FIGS. 6 to 11, a section of a second light sensing pixel PSR2 as previously discussed is illustrated. For convenience of description, the pixel circuit layer has been omitted. In the following embodiment, components identical to those which have already described are designated by like reference numerals, and redundant descriptions will be omitted or simplified.

Referring to FIGS. 6 to 11, a sensor layer SSL of the second light sensing pixel PSR2 may include a second light receiving element OPD2 receiving light. The second light receiving element OPD2 may be an optical-type sensor. In an example, the second light receiving element OPD2 may include one of a photodiode, a CMOS image sensor, a CCD camera, or a photo transistor, but the present disclosure is not necessarily limited thereto.

The second light receiving element OPD2 may include a first electrode E1, a second light receiving layer OPL2 (or photoelectric conversion layer), and a second electrode E2. The second light receiving layer OPL2 may be disposed between the first electrode E1 and the second electrode E2. The second light receiving layer OPL2 may be disposed on the first electrode E1 at an area exposed by the bank PDL. The second light receiving layer OPL2 may be made of an organic photosensitive material. For example, the organic photosensitive material may include a dithiolene-based material (BDN) (Bis(4-dimethylamino-dithiobenzil)nickel (II)), a benzotriazole-based compound (PTZBTTT-BDT), a porphyrin-based small molecule material (DHTBTEZP), or the like, but the present disclosure is not necessarily limited thereto.

In one embodiment, the second light receiving layer OPL2 may include the same material used to form the first light receiving layer OPL1. Also, the second light receiving layer OPL2 may be disposed in the same layer as the first light receiving layer OPL1. The second light receiving layer OPL2 may be simultaneously formed with the first light receiving layer OPL1 through the same process, but the present disclosure is not necessarily limited thereto.

Figure 6:
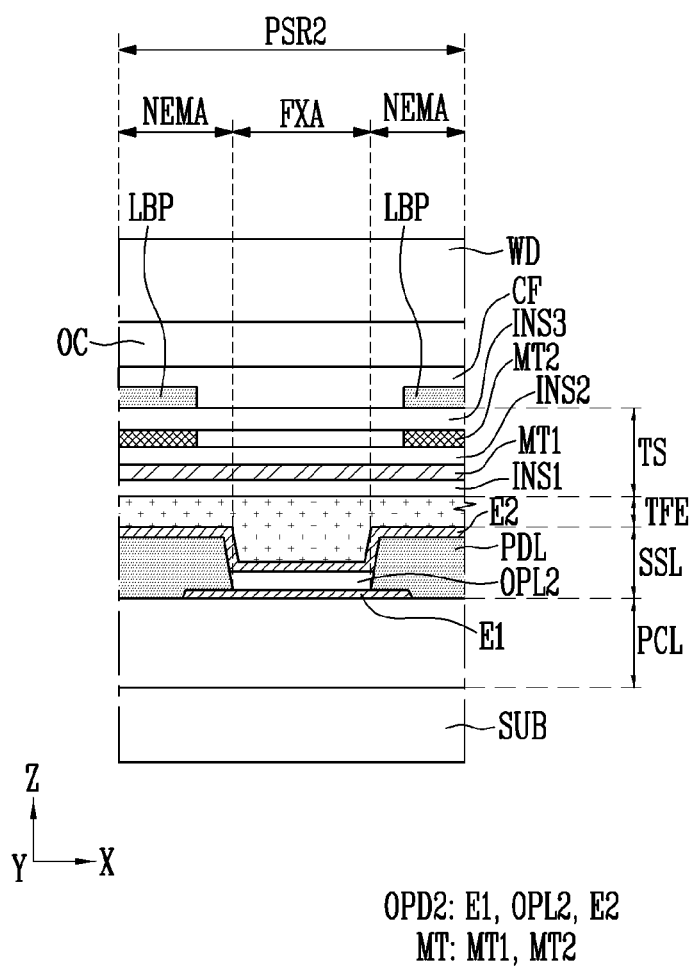
FIGS. 6 to 11 are sectional views illustrating a display panel in accordance with an embodiment of the present disclosure.

The second light receiving element OPD2 may sense a current in a dark state, which is caused by a light blocking structure, to thereby remove noise. For example, correction data is generated based on a signal received through the second light receiving element OPD2 (e.g., under control of the driving circuit), and an offset is applied by the driving circuit to the first light receiving element OPD1 by using the correction data, so that the fingerprint recognition accuracy of the first light sensing pixel PSR1 can be improved. To this end, as shown in FIG. 6 and unlike in the case of the first light receiving element OPD1, first sensing conductive layer MT1 is disposed on the second light receiving element OPD2, to thereby block external light from being introduced into the light receiving layer of the second light receiving element OPD2. Through this arrangement, accurate dark calibration can be performed.

In an embodiment, a calibration process may further include a white calibration process of correcting noise identified using a skin color reflector. In addition, each calibration may be performed several times according to a brightness section of the light source (or the first light emitting element LD1), but the present disclosure is not necessarily limited thereto.

The first sensing conductive layer MT1 may be disposed to at least partially overlap with the second light receiving element OPD2. In one embodiment, the first sensing conductive layer MT1 may be disposed to completely overlap with the second light receiving element OPD2 for the purpose of external light blocking.

Figure 7:
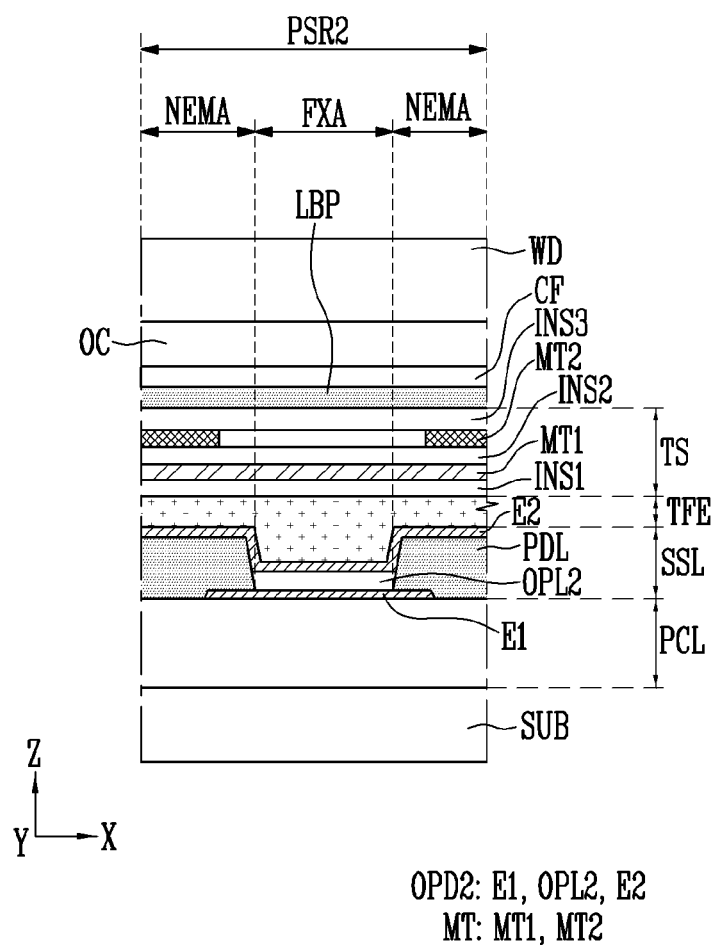

In addition, as shown in FIG. 7, the above-described light blocking layer LBP may be further disposed above the second light receiving element OPD2. The light blocking layer LBP may be disposed to completely overlap with the second light receiving element OPD2 for the purpose of external light blocking. The light blocking layer LBP may overlap with the first sensing conductive layer MT1 above the second light receiving element OPD2.

Figure 8:
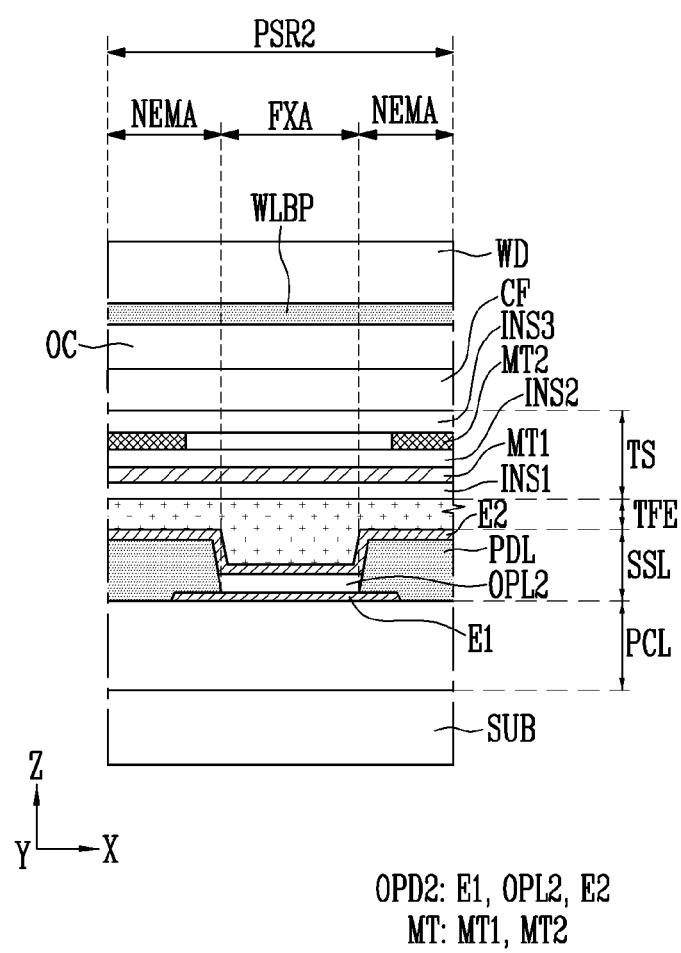

In addition, as shown in FIG. 8, a window light blocking layer WLBP may be further disposed above the second light receiving element OPD2. The window light blocking layer WLBP may be disposed to completely overlap with the second light receiving element OPD2 for the purpose of external light blocking. The window light blocking layer WLBP may overlap with the first sensing conductive layer MT1 above the second light receiving element OPD2.

The window light blocking layer WLBP may be disposed between the overcoat layer OC and the window WD. The window light blocking layer WLBP may include a light blocking material so as to prevent light leakage. In an example, the window light blocking layer WLBP may include a black matrix, but the present disclosure is not necessarily limited thereto. In some embodiments, the window light blocking layer WLBP may include may include a carbon black (CB) and/or a titan black (TiBK).

Figure 9:
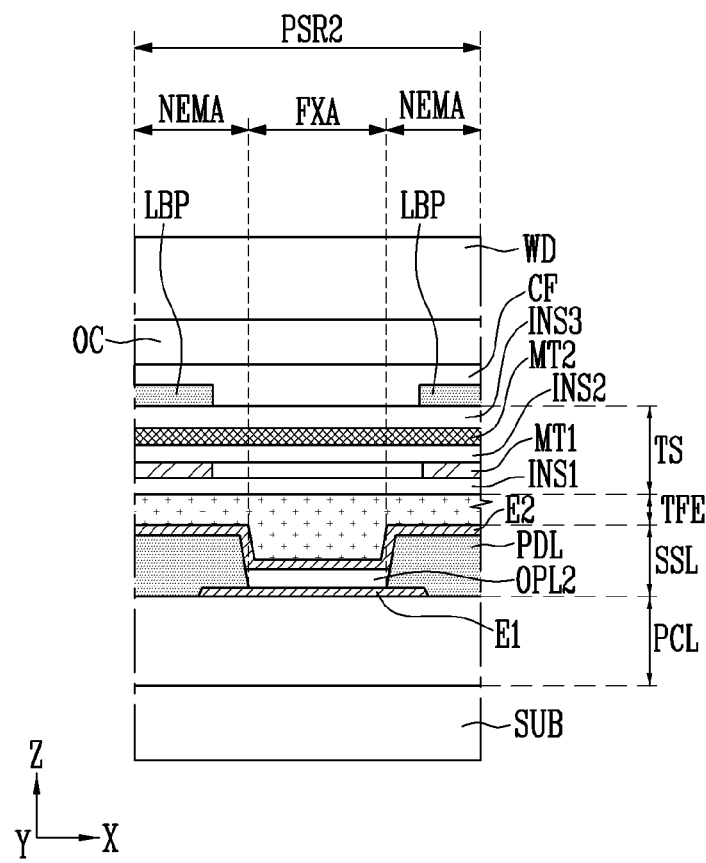

In addition, as shown in the embodiment of FIG. 9, a second sensing conductive layer MT2 may be disposed above the second light receiving element OPD2, thereby blocking external light from being introduced into the second light receiving element OPD2. The second sensing conductive layer MT2 may be disposed to overlap with the second light receiving element OPD2. The second sensing conductive layer MT2 may be disposed to completely overlap with the second light receiving element OPD2 for the purpose of external light blocking.

Figure 10:
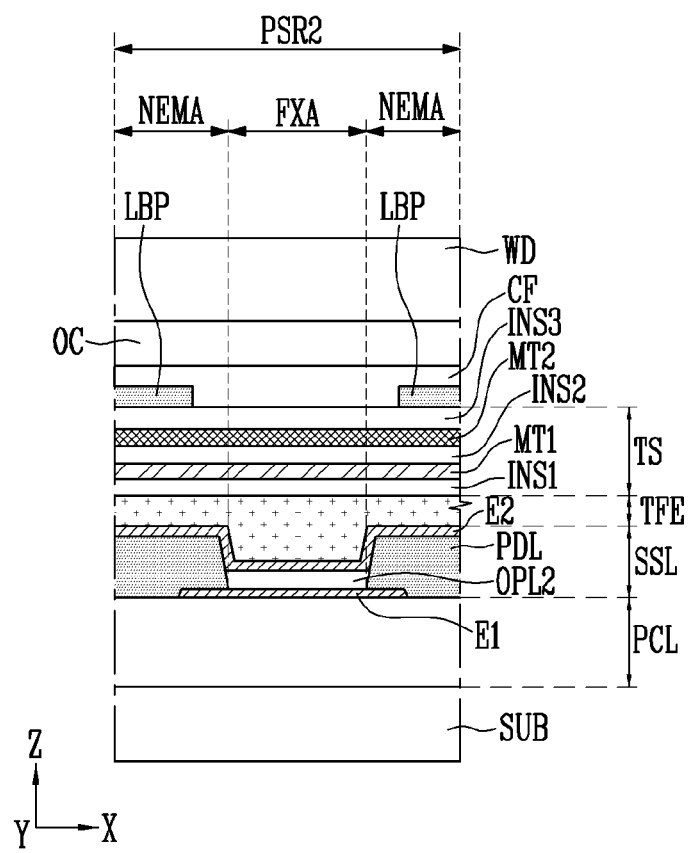

In addition, as shown in the embodiment of FIG. 10, the first sensing conductive layer MT1 and the second sensing conductive layer MT2 may be disposed on the second light receiving element OPD2, to thereby block external light from being received by the second light receiving element OPD2. The first sensing conductive layer MT1 and the second sensing conductive layer MT2 may therefore be disposed to overlap with the second light receiving element OPD2. In one embodiment, the first sensing conductive layer MT1 and the second sensing conductive layer MT2 may be disposed to completely overlap with the second light receiving element OPD2 for the purpose of external light blocking. As described above, when the sensing conductive layers MT1 and MT2, the light blocking layer LBP, and/or the window light blocking layer WLBP (which are used for external light blocking) are disposed on the second light receiving element OPD2, accurate correction data can be generated through the second light receiving element OPD2. Thus, an accurate offset can be applied by the driving circuit to the first light sensing pixels PSR1, and accordingly the fingerprint recognition accuracy of the first light sensing pixel PSR1 can be improved.

Figure 11:
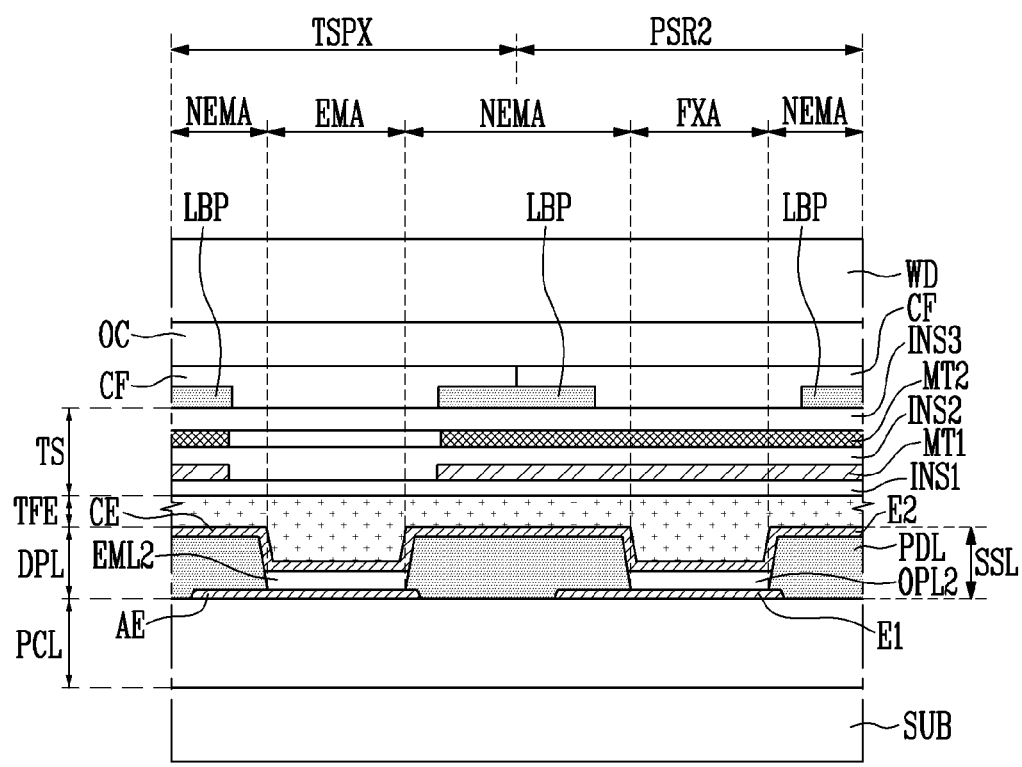

In some embodiments, as shown in FIG. 11, the display panel DP may further include a test pixel TSPX. For example, the test pixel TSPX may be disposed in the display area DA and/or the non-display area NDA. The test pixel TSPX may be substantially identical to the above-described sub-pixel SPX. However, the present disclosure is not necessarily limited thereto, and the test pixel TSPX may serve as a dummy pixel.

The test pixel TSPX may include a second light emitting element LD2 emitting light. The second light emitting element LD2 may include an anode electrode AE, a second light emitting element EML2, and a cathode electrode CE. The second light emitting element LD2 may be a top emission organic light emitting element.

The second light emitting layer EML2 may be disposed between the anode electrode AE and the cathode electrode CE. The second light emitting layer EML2 may be disposed on the anode electrode AE at an area exposed by the bank PDL. The second light emitting layer EML2 may include the same material as the above-described first light emitting layer EML1. Also, the second light emitting layer EML2 may be disposed in the same layer as the first light emitting layer EML1. The second light emitting layer EML2 may be simultaneously formed with the first light emitting layer EML1 through the same process, but the present disclosure is not necessarily limited thereto.

In some embodiments, the first sensing conductive layer MT1 may be partially opened so that it does not overlap with the second light emitting element LD2. For example, an opening of the first sensing conductive layer MT1 may be formed to overlap with the second light emitting element LD2. In an example, the first sensing conductive layer MT1 may be disposed to overlap with the non-emission area NEMA at the periphery of the emission area EMA.

In addition, the second sensing conductive layer MT2 may be partially opened so that it does not overlap with the second light emitting element LD2. That is, an opening of the second sensing conductive layer MT2 may be formed to overlap with the second light emitting element LD2. In an example, the second sensing conductive layer MT2 may be disposed to overlap with the non-emission area NEMA at the periphery of the emission area EMA.

In addition, the light blocking layer LBP may be partially opened so that it does not overlap with the second light emitting element LD2. That is, an opening of the light blocking layer LBP may be formed to overlap with the second light emitting element LD2. In an example, the light blocking layer LBP may be disposed to overlap with the non-emission area NEMA at the periphery of the emission area EMA.

Figure 12:
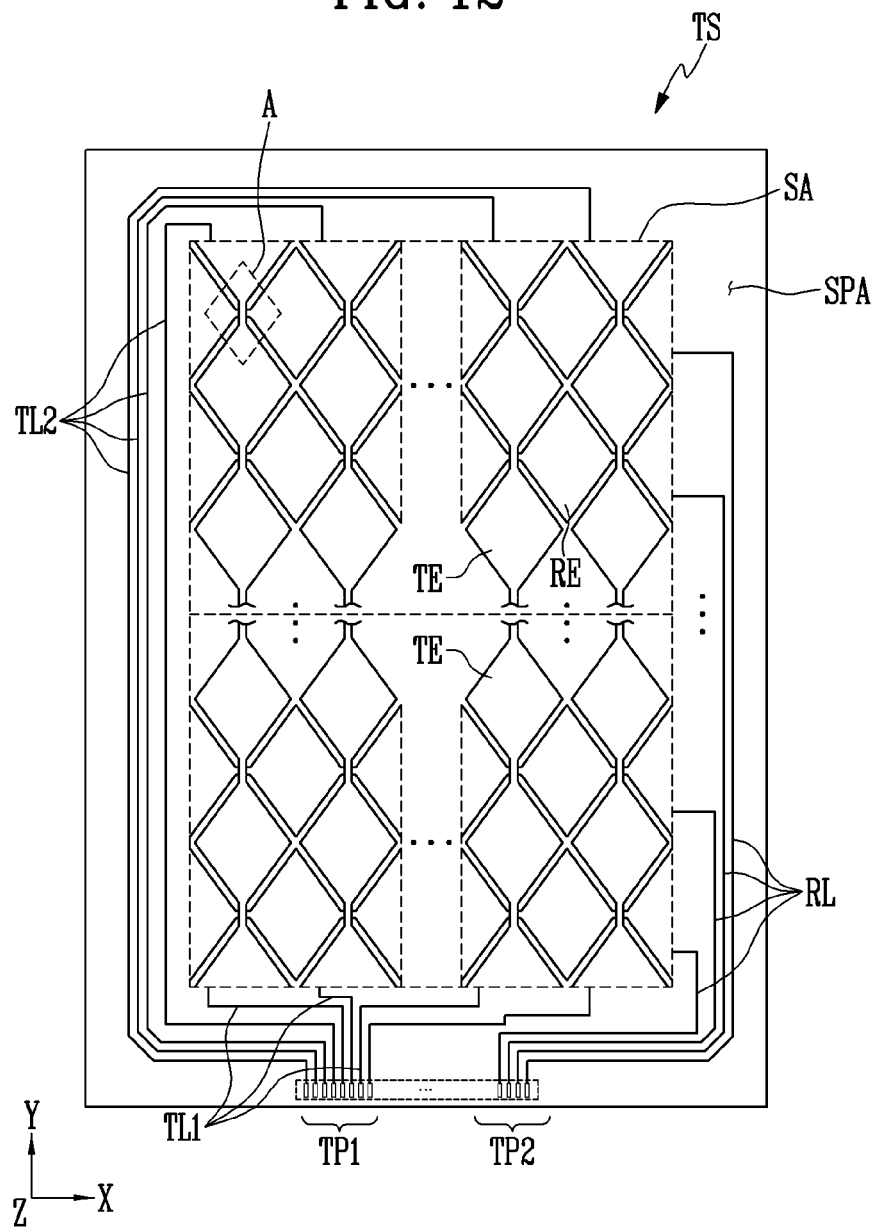
FIG. 12 is a plan view illustrating a touch sensing layer in accordance with an embodiment of the present disclosure.
Figure 13:
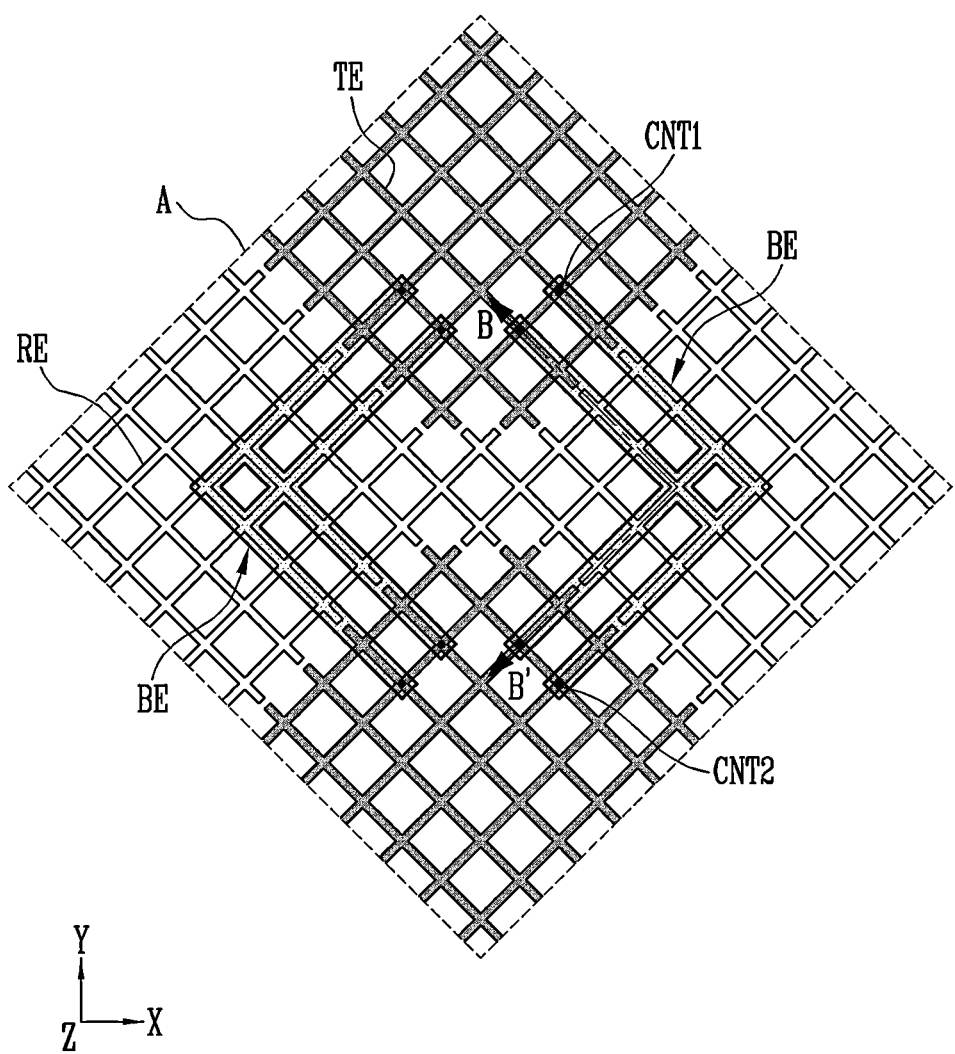
FIG. 13 is an enlarged view of area A shown in FIG. 12.
Figure 14:
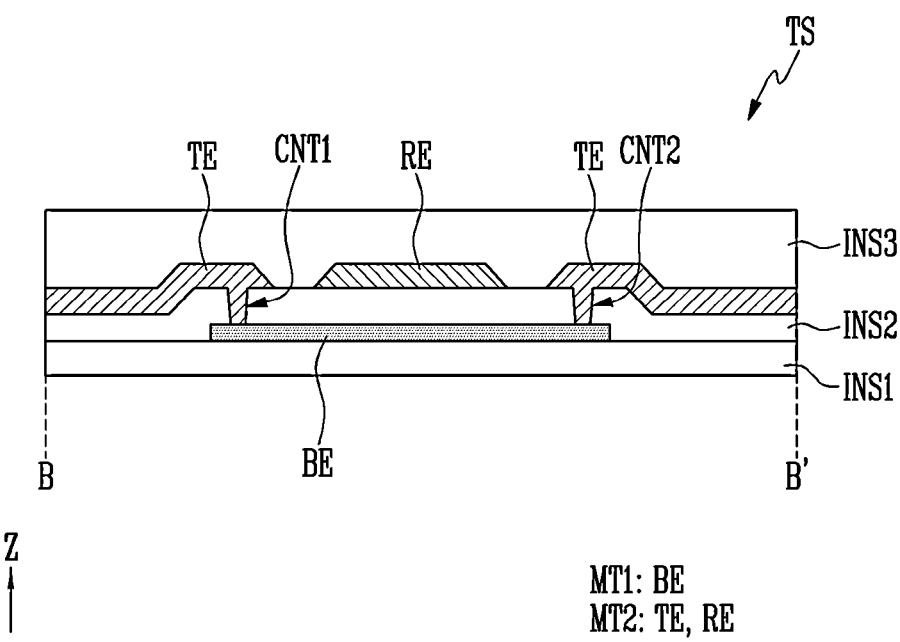
FIG. 14 is a sectional view taken along light B-B' shown in FIG. 13.

FIG. 12 is a plan view illustrating a touch sensing layer in accordance with an embodiment of the present disclosure. FIG. 13 is an enlarged view of area A shown in FIG. 12. FIG. 14 is a sectional view taken along light B-B' shown in FIG. 13.

In FIG. 12, a case is shown where sensing electrodes TE and RE of the touch sensing layer TS include first sensing electrodes TE and second sensing electrodes RE. The first sensing electrodes TE and the second sensing electrodes RE may be driven in a two-layer mutual capacitance manner in which, after a driving signal is applied to the first sensing electrodes TE, variations of mutual capacitances are sensed through the second sensing electrodes RE, but the present disclosure is not limited thereto. For example, the touch sensing layer TS may include first sensing electrodes TE and second sensing electrodes RE without any connection electrodes BE, and may be driven in a one-layer mutual capacitance manner. Alternatively, the touch sensing layer TS may be driven in a one-layer self-capacitance manner in which variations of self-capacitances are sensed by using one kind of sensing electrodes.

Referring to FIG. 12, the touch sensing layer TS includes a sensing area SA for sensing a touch of a user and a sensing peripheral area SPA disposed at the periphery of the sensing area SA. The sensing area SA may overlap with the display area DA, and the sensing peripheral area SPA may overlap with the non-display area NDA.

First sensing electrodes TE may be disposed along the second direction (Y-axis direction) and may be electrically connected to each other. Second sensing electrodes RE may be disposed along the first direction (X-axis direction) intersecting the second direction (Y-axis direction), and may be electrically connected to each other. The first sensing electrodes TE and the second sensing electrodes RE may be electrically separated from each other. The first sensing electrodes TE and the second sensing electrodes RE may be disposed to be spaced apart from each other.

Referring to FIG. 13, first sensing electrodes TE adjacent in the second direction (Y-axis direction) may be electrically connected to each other by connection electrodes BE, and first sensing electrodes TE adjacent in the first direction (X-axis direction) may be electrically insulated from each other. In addition, second sensing electrodes RE adjacent in the first direction (X-axis direction) may be electrically connected to each other, and second sensing electrodes RE adjacent in the second direction (Y-axis direction) may be electrically insulated from each other. Accordingly, a mutual capacitor may be formed at an intersection point of the first sensing electrodes TE and the second sensing electrode RE. A voltage charged in the mutual capacitor is sensed, so that whether a touch of a user has been input can be determined.

The connection electrodes BE may be connected to the first sensing electrodes TE adjacent in the second direction (Y-axis direction) through a first contact hole CNT1 and a second contact hole CNT2, respectively. One end of the connection electrode BE may be connected to one first sensing electrode TE among the first sensing electrodes TE adjacent in the second direction (Y-axis direction) through the first contact hole CNT1. The other end of the connection electrode BE may be connected to another first sensing electrode TE among the first sensing electrodes TE adjacent in the second direction (Y-axis direction) through the second contact hole CNT2. Although a structure in which the first sensing electrodes TE are connected to each other by a pair of connection electrodes BE is exemplified in FIG. 13, the present disclosure is not limited thereto. For example, the connection electrode BE may include a plurality of sub-connection electrodes forming several pairs of sub-connection electrodes.

In one embodiment, the first sensing electrode TE and the second sensing electrode RE may be formed in a mesh shape or a net shape. Thus, the luminance of light emitted from the sub-pixel SPX can be prevented from being deteriorated by the first sensing electrode TE and the second sensing electrode RE. To this end, the mesh structure of the first sensing electrode TE and the second sensing electrode RE may be disposed to overlap with the non-emission area (e.g., NEMA shown in FIG. 4).

Referring back to FIG. 12, sensing pads TP1 and TP2 and sensing lines TL1, TL2, and RL may be disposed in the sensing peripheral area SPA. The sensing pads TP1 and TP2 may be disposed at one side of the sensing peripheral area SPA. The sensing pads TP1 and TP2 may include a first sensing pad TP1 and a second sensing pad TP2.

The sensing lines TL1, TL2, and RL may include driving lines TL1 and TL2 and a sensing line RL connected to the second sensing electrode RE.

The driving lines TL1 and TL2 may include a first driving line TL1 and a second driving line TL2. The first driving line TL1 may be connected to the first sensing electrode TE, which is disposed at one side of the sensing area SA. The second driving line TL2 may be connected to the first sensing electrode TE, which is disposed at the other side of the sensing area SA. The one side of the sensing area SA may correspond to a bottom side of the sensing area SA, and the other side of the sensing area SA may correspond to a top side of the sensing area SA.

The top side and bottom side of the sensing area SA may face each other. For example, as shown in FIG. 12, a first sensing electrode TE, disposed at a bottom side end among first sensing electrodes TE electrically connected to each other in the second direction (Y-axis direction), may be connected to the first driving line TL1. A first sensing electrode TE disposed at a top side end, among the first sensing electrodes TE electrically connected to each other in the second direction (Y-axis direction), may be connected to the second driving line TL2.

The second driving line TL2 may be connected to the first sensing electrode TE at the top side of the sensing area SA via the left side of the sensing area SA. First ends of the driving lines TL1 and TL2 may be connected to the first sensing electrode TE, and second ends of the driving lines TL1 and TL2 may be connected to the first sensing pad TP1.

Second sensing electrodes RE disposed at the one side of the sensing area SA may be connected to the sensing lines RL. For example, as shown in FIG. 12, a second sensing electrode RE disposed at the right side among second sensing electrodes RE electrically connected to each other in the first direction (X-axis direction) may be connected to a sensing line RL. One end of the sensing line RL may be connected to the second sensing electrode RE, and the other end of the sensing line RL may be connected to the second sensing pad TP2.

Referring to FIG. 14, the first sensing conductive layer MT1 may include the above-described connection electrode BE. The second sensing conductive layer MT2 may include the above-described first sensing electrodes TE and the above-described second sensing electrodes RE.

One of adjacent first sensing electrodes TE may be electrically connected to one end of the connection electrode BE through the first contact hole CNT1 penetrating the second insulating layer INS2. Another of the adjacent first sensing electrodes TE may be electrically connected to the other end of the connection electrode through the second contact hole CNT2 penetrating the second insulating layer INS2.

In addition, the first insulating layer INS1, the first sensing conductive layer MT1, the second insulating layer INS2, the second sensing conductive layer MT2, and/or the third insulating layer INS3 of the touch sensing layer TS have been described in detail with reference to FIG. 4 and the like, and therefore redundant descriptions will be omitted.

In accordance with the present disclosure, a sensing conductive layer and the like are disposed on a light receiving element for the purpose of accurate calibration. The sensing conductive layer serves to block external light from being introduced into the light receiving element. Thus, fingerprint recognition accuracy can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims. Some or different aspects from different embodiments may be combined to form additional embodiments.

The invention claimed is:

1. A display device comprising:
a light emitting sub-pixel disposed in a display area;
a light receiving pixel disposed in the display area or a non-display area; and
a touch sensing layer including a sensing conductive layer overlapping with the light receiving pixel.

2. The display device of claim 1, wherein the sensing conductive layer includes an opening overlapping with the light emitting sub-pixel.

3. The display device of claim 1, further comprising:
a light blocking layer disposed above the light receiving pixel.

4. The display device of claim 3, wherein the light blocking layer includes an opening overlapping with a light emitting layer of the light emitting sub-pixel.

5. The display device of claim 1, wherein the sensing conductive layer includes first sensing electrodes disposed along a first direction.

6. The display device of claim 5, wherein the sensing conductive layer includes second sensing electrodes disposed along a second direction intersecting the first direction.

7. The display device of claim 6, further comprising:
connection electrodes connecting adjacent first sensing electrodes to each other.

8. The display device of claim 7, wherein the sensing conductive layer includes:
a first sensing conductive layer;
a second sensing conductive layer disposed on the first sensing conductive layer; and
an insulating layer disposed between the first sensing conductive layer and the second sensing conductive layer.

9. The display device of claim 8, wherein the first sensing conductive layer includes the connection electrodes.

10. The display device of claim 9, wherein the second sensing conductive layer includes the first sensing electrodes and the second sensing electrodes.

11. A display device comprising:
a first light receiving pixel disposed in a display area;
a second light receiving pixel disposed in one of the display area or a non-display area; and
a touch sensing layer including a sensing conductive layer overlapping with the second light receiving pixel.

12. The display device of claim 11, further comprising:
a first light emitting sub-pixel disposed in the display area.

13. The display device of claim 12, wherein the sensing conductive layer includes an opening overlapping with the first light emitting sub-pixel.

14. The display device of claim 11, further comprising:
a second light emitting sub-pixel disposed in the display area.

15. The display device of claim 14, wherein the sensing conductive layer includes an opening overlapping with the second light emitting sub-pixel.

16. The display device of claim 11, wherein the first light receiving pixel includes:
a first electrode;
a second electrode disposed on the first electrode; and
a first light receiving layer disposed between the first electrode and the second electrode.

17. The display device of claim 16, wherein the second light receiving pixel includes a second light receiving layer disposed between the first electrode and the second electrode.

18. The display device of claim 17, wherein the first light receiving layer and the second light receiving layer include a same material.

19. The display device of claim 16, further comprising:
a light emitting sub-pixel including a light emitting layer disposed between the first electrode and the second electrode.

20. The display device of claim 11, further comprising:
a light blocking layer disposed above the second light receiving pixel.

21. A display device comprising:
a sub-pixel configured to emit light;
at least one sensing conductive layer;
a first light sensing pixel in a display area; and
a second light sensing pixel in a non-display area,
wherein the first light sensing pixel is configured to sense light emitted from the sub-pixel, as reflected from a finger, to detect a fingerprint and wherein:
the at least one sensing conductive layer includes an opening aligned with a light receiving layer of the first light sensing pixel, and
the at least one sensing conductive layer overlaps with a light receiving layer of the second light sensing pixel.

22. The display device of claim 21, wherein the at least one sensing conductive layer is positioned to block external light from being received by the light receiving layer of the second light sensing pixel.

23. The display device of claim 22, further comprising:
a driving circuit configured to calibrate the first light sensing pixel based on a signal received through the light receiving layer of the second light sensing pixel.

24. The display device of claim 21, wherein the driving circuit is configured to perform dark calibration of the first light sensing pixel.

25. The display device of claim 21, wherein the driving circuit is configured to perform white calibration of the first light sensing pixel.

26. The display device of claim 21, wherein the at least one sensing conductive layer includes:
a first sensing conductive layer overlapping with the light receiving layer of the second light sensing pixel; and
a second sensing conductive layer including an opening aligned with the light receiving layer of the second light sensing pixel.

27. The display device of claim 21, wherein the first sensing conductive layer is electrically coupled to the second sensing conductive layer in an area between the sub-pixel and the first light sensing pixel.

* * * * *